US009527727B2

(12) United States Patent
Cachia

(10) Patent No.: US 9,527,727 B2
(45) Date of Patent: Dec. 27, 2016

(54) PACKAGES FOR SEMICONDUCTOR DEVICES AND METHODS FOR ASSEMBLING SAME

(71) Applicant: STMicroelectronics (Malta) Ltd, Kirkop (MT)

(72) Inventor: Conrad Cachia, Tarxien (MT)

(73) Assignee: STMICROELECTRONICS (MALTA) LTD, Kirkop (MT)

( * ) Notice: Subject to any disclaimer, the term of this patent is extended or adjusted under 35 U.S.C. 154(b) by 0 days.

(21) Appl. No.: 14/498,824

(22) Filed: Sep. 26, 2014

(65) Prior Publication Data
US 2016/0090301 A1   Mar. 31, 2016

(51) Int. Cl.
*B81C 1/00* (2006.01)
*B81B 7/00* (2006.01)

(52) U.S. Cl.
CPC .......... *B81C 1/0023* (2013.01); *B81B 7/0074* (2013.01); *B81C 2203/0792* (2013.01); *H01L 2224/48091* (2013.01); *H01L 2224/48227* (2013.01); *H01L 2224/48464* (2013.01); *H01L 2224/73207* (2013.01); *H01L 2224/73265* (2013.01); *H01L 2224/94* (2013.01); *H01L 2924/181* (2013.01)

(58) Field of Classification Search
CPC ...................... B81C 1/0023; B81C 2203/0792; B81B 7/0074
See application file for complete search history.

(56) References Cited

U.S. PATENT DOCUMENTS 7,750,455 B2 * 7/2010 Pagaila ............... H01L 25/0657
257/686
2011/0303993 A1 * 12/2011 Yamamoto ................ G01L 1/18
257/415

FOREIGN PATENT DOCUMENTS

KR         20100009685 A  *  1/2010  ............. H01L 24/97

OTHER PUBLICATIONS

Machine translation of KR 20100009685 A (Jan. 2010).*

* cited by examiner

*Primary Examiner* — Lex Malsawma
(74) *Attorney, Agent, or Firm* — Seed IP Law Group LLP

(57) ABSTRACT

One or more embodiments of the present disclosure are directed to packages that include a stacked microelectromechanical sensor MEMS die and an application-specific integrated circuit (ASIC) die. The smaller of the MEMS die and the ASIC die is stacked on the larger of the MEMS die and the ASIC die. The larger of the two dice may form one or more dimensions of the package. In one embodiment, a bottom surface of the larger of the two dice forms an outer surface of the package. In that regard, the package may take less lateral space on another component, such as a board or other package.

21 Claims, 5 Drawing Sheets

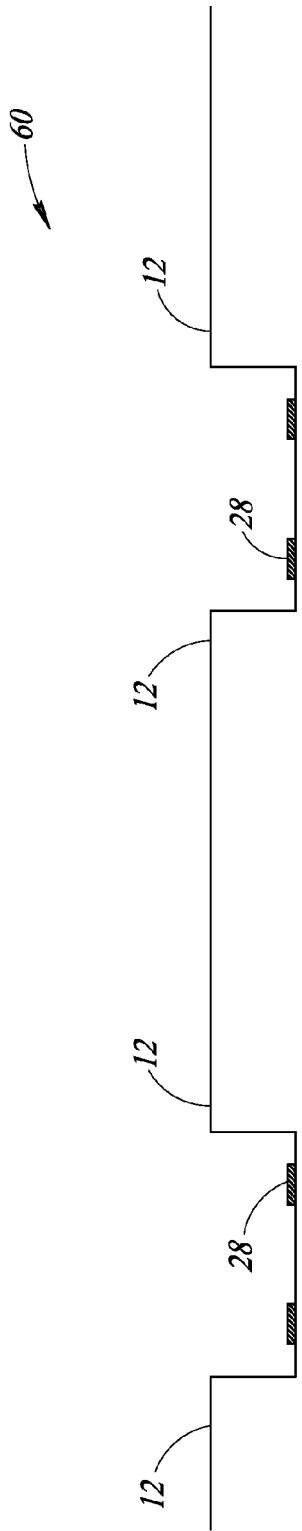
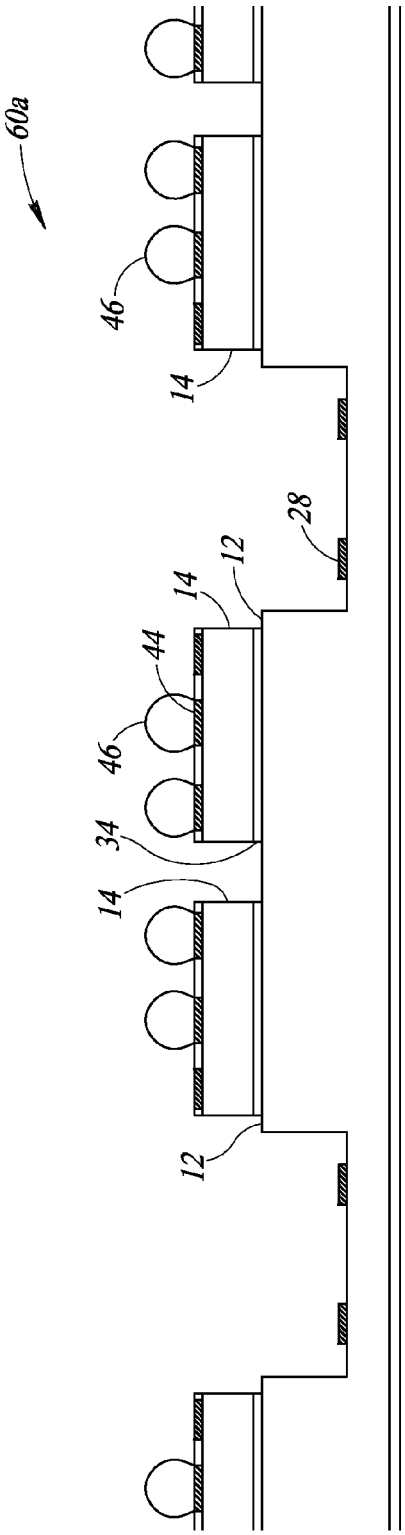
FIG.2A
FIG.2B

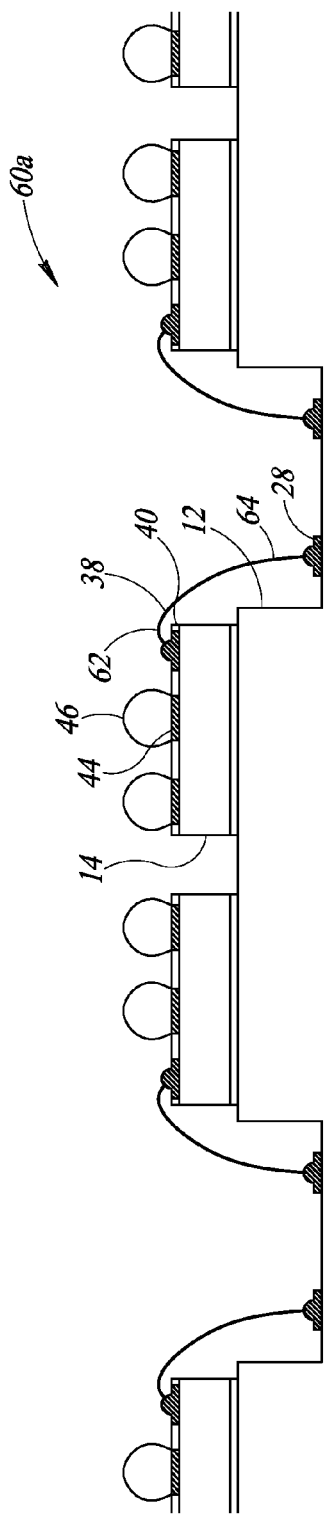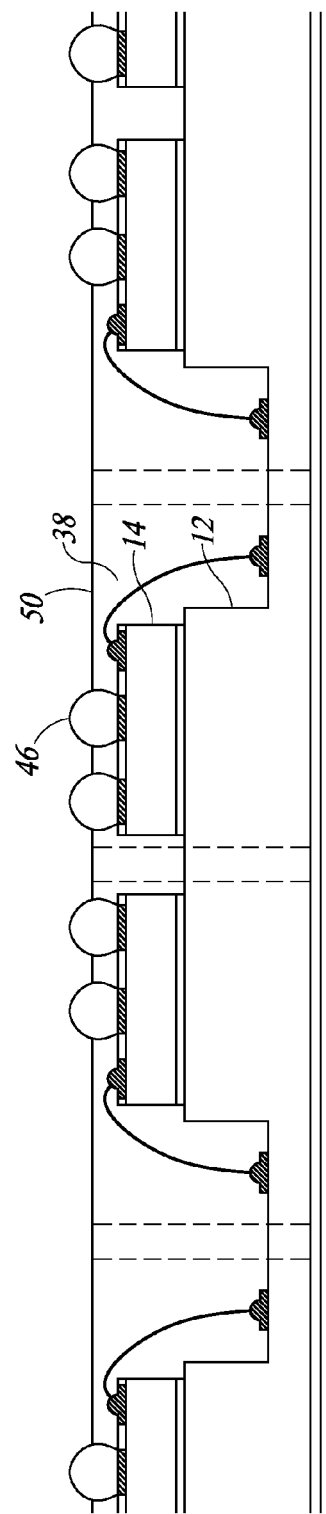

PACKAGES FOR SEMICONDUCTOR DEVICES AND METHODS FOR ASSEMBLING SAME

BACKGROUND

Technical Field

The present disclosure generally relates to the field of semiconductor packaging and methods for assembling same.

Description of the Related Art

Semiconductor die are packaged to protect the die from the external environment and to provide mechanical support. For manufacturers of semiconductor devices, there is a continuing pressure to increase the size of the packages. One response to this pressure has been the development of chip scale and wafer level packaging. These are packages that have a footprint that is very close to the actual area of the semiconductor die. Chip scale packages are generally direct surface mountable, using, e.g., ball grid arrays (BGA) and flip chip configurations.

Another response has been to assemble system-in-packages (SiP), which include multiple semiconductor dice or chips enclosed in a single package body. For instance, micro-electromechanical systems (MEMS) packages often include a MEMS die and an application-specific integrated circuit (ASIC) die coupled to a substrate in a side by side configuration. The ASIC die is electrically coupled to the MEMS die and to the substrate, such as by conductive wires.

To further reduce package size, the MEMS die and ASIC die may be stacked on each other over the substrate. In general, the larger die would be on the bottom and coupled to the substrate. That is, a stack may include an ASIC coupled to the substrate and a MEMS die, which is smaller than the ASIC die, is coupled to an upper surface of the MEMS die.

Conductive through vias to couple the MEMS and ASIC dice together are often utilized to further reduce package sizes. Conductive through vias, however, typically require expensive processing techniques. Thus, there remains a continued desire to provide smaller packages at reduced costs.

BRIEF SUMMARY

One or more embodiments of the present disclosure are directed to packages that include a stacked microelectromechanical sensor MEMS die and an application-specific integrated circuit (ASIC) die. The smaller of the MEMS die and the ASIC die is stacked on the larger of the MEMS die and the ASIC die. The larger of the two dice may form one or more dimensions of the package. In one embodiment, a bottom surface of the larger of the two dice forms an outer surface of the package. In that regard, the package may take less lateral space on another component, such as a board or other package.

In one embodiment, the ASIC die is smaller than the MEMS die and thus stacked on the MEMS die. The MEMS die and ASIC die are electrically coupled together by one or more conductive wires. Conductive bumps for coupling the package to another component are formed on the ASIC die or on a redistribution layer formed on the ASIC die. A molding compound is formed over the ASIC die and MEMS die. The molding compound encapsulates the conductive wire and covers a portion of conductive bumps.

In some embodiments, an end of the conductive wires are attached to a bond pad of the ASIC die in a way that minimizes the uppermost height of the conductive wire. In that regard, a third dimension (height) of package may be minimized. The package may thus be formed without utilizing through vias extending through either the ASIC die or the MEMS die. Through vias, although helpful at reducing package thickness, are expensive to process. Thus, one or more embodiments allow for thin packages at reasonable costs.

In some embodiments, the ASIC die may be offset on the surface of the MEMS die such that a portion of the ASIC die overhangs a surface of the MEMS die. Although this may increase one dimension of the package, at least one dimension of MEMS die defines a dimension of the package.

Another embodiment is directed to a package that includes a MEMS die that is smaller than the ASIC die. In this embodiment, the MEMS die is stacked on the ASIC die. In that regard, the dimensions of the ASIC die may delimit two dimensions of the package.

The MEMS die and the ASIC die are electrically coupled by one or more conductive wires. In such embodiments, a connector die may be located over the MEMS die, such as secured to a surface of the MEMS die. The connector die includes conductive and insulative layers and is provided for electrically coupling the MEMS die and the ASIC die outside of the package. In that regard, the conductive layers of the connector die may form traces, bond pads, and conductive vias and the insulative layers may be provided therebetween. A first set of the bond pads of the connector die are utilized for coupling the ASIC die to the connector die. A second set of the bond pads of the connector die have conductive bumps formed thereon. A molding compound is formed over the ASIC and MEMS dice and the connector die. The molding compound encapsulates the conductive wires. A first portion of the conductive bumps are covered by the molding compound and a second portion of the conductive bumps extend therefrom for coupling to another device.

BRIEF DESCRIPTION OF THE SEVERAL VIEWS OF THE DRAWINGS

In the drawings, identical reference numbers identify similar elements. Sizes and relative positions of elements in the drawings are not necessarily drawn to scale.

FIGS. 2A-2D show processing steps for forming the package of FIG. 1.

DETAILED DESCRIPTION

Figure 1:
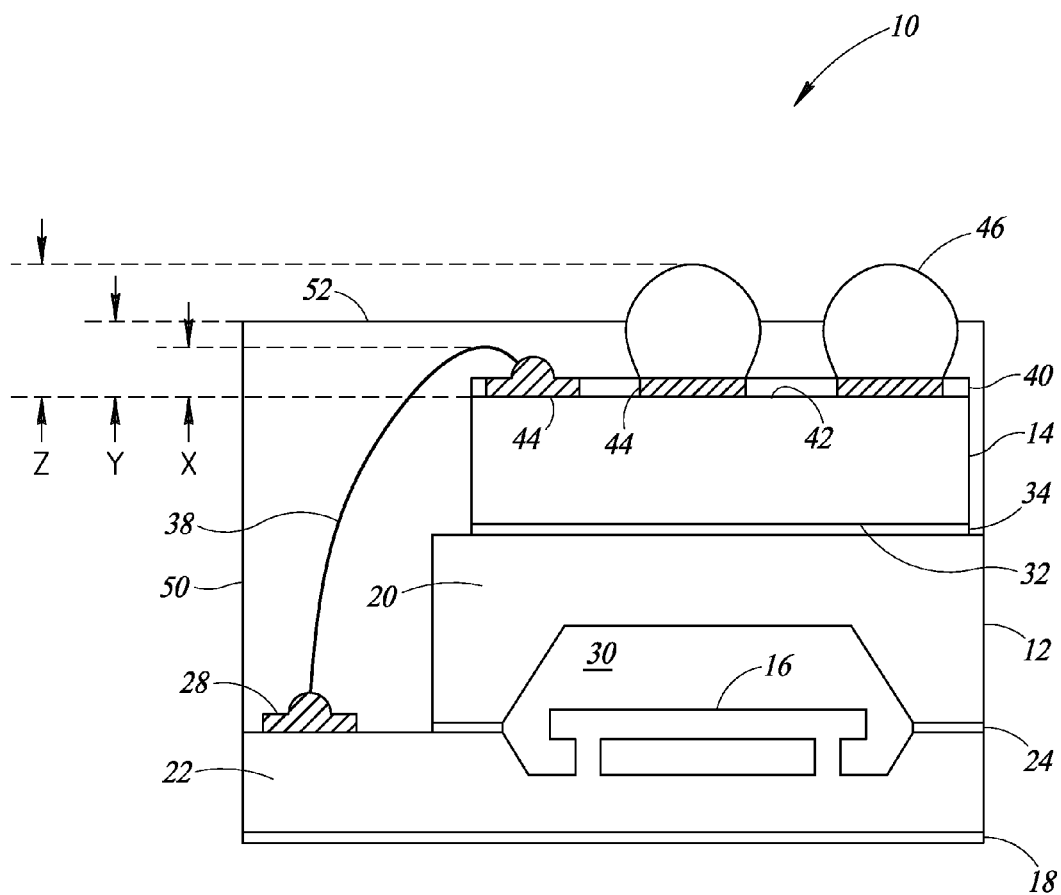
FIG. 1 shows a package according to one embodiment of the disclosure.

FIG. 1 shows a chip scale package 10 that includes a MEMS die 12 on an integrated device, such as an application-specific integrated circuit (ASIC) die 14 in accordance with one embodiment. In the illustrated embodiment, the ASIC die 14 is smaller than the MEMS die 12.

The MEMS die 12 includes a cap 20 and a substrate 22 that is secured to the cap 20 forming a cavity 30 therebetween. The cap 20 may be secured by any material suitable for securing the cap 20 to the substrate 22, such as glue, paste, or any other adhesive material.

The substrate 22 of the MEMS die 12 is formed from a semiconductor material, such as silicon, and integrates a moveable micro-electromechanical structure 16, such as a sensor, configured to detect an electrical parameter, such as capacitance or resistance. In particular, moveable micro-electromechanical structure 16 may include one or more beams, membranes, fingers, or other moveable structure are is configured to move in response one or more external forces. The moveable micro-electromechanical structure 16 is located in the cavity 30 of the MEMS die 12. The cavity 30 provides an empty space that will ensure freedom of movement of the moveable micro-electromechanical structure 16. Although the cavity 30 in the illustrated embodiment is formed in part by the cap 17, in other embodiments, the cavity may be formed solely by the cap or by the substrate.

The MEMS die 12 is formed at wafer level using standard semiconductor processing steps and is singulated to form the individual MEMS die 12 as is well known in the art.

An upper surface of the substrate 22 includes a plurality of contact pads 28. The MEMS die 12 may include a coating 18, such as an opaque or reflective coating, on its bottom surface.

Stacked on the cap 20 of the MEMS die 12 is the ASIC die 14. In particular, a bottom surface 32 of the ASIC die 14 is coupled to the cap 20 of the MEMS die 12 by an adhesive material 34, such as glue, paste, double-sided tape, or any other suitable adhesive material. The ASIC die 14 is also formed from a semiconductor material, such as silicon, and integrates one or more electronic device or circuit. The ASIC die 14 is formed at wafer level using standard semiconductor processing steps and is singulated to form the individual ASIC die 14 as is well known in the art.

The ASIC die 14 is electrically coupled to the MEMS die 12 by conductive wires 38 and configured to receive and send signals therebetween. Although only one conductive wire is shown it is to be appreciated that a plurality of conductive wires may be coupled between the MEMS die 12 and the ASIC die 14.

As is well known in the art, the ASIC die 14 receives signals indicative of the electrical parameter detected by the MEMS die 12 and includes functionality for reading the electrical parameter detected by the MEMS die 12. The ASIC die 14 may moreover have further functions of processing and evaluating, such as amplifying and filtering, the detected parameters.

A redistribution layer 40 may be formed on an upper surface 42 of the ASIC die 14 as is well known in the art. The redistribution layer 40 includes one or more conductive and insulative layers. For instance, the redistribution layer 40 may include contact pads 44, traces, and through vias separated by an insulative material. The redistribution layer 40 redistributes the bond pads (not shown) of the ASIC die 14. In that regard, electrical connections to the bond pads of the ASIC die 14 may be spread farther apart from each other.

Conductive bumps 46, such as solder balls, are located on the contact pads 44 of the redistribution layer 40 (or on the bond pads of the ASIC die 14 in embodiments without a redistribution layer). The conductive bumps 46 are configured to electrically couple the package 10 to another component, such as a circuit board or another package.

A molding compound 50 is located over the MEMS die 12 and the ASIC die 14. The conductive wires 38 are embedded in the molding compound 50 while a portion of the conductive bumps 46 have a portion that extends beyond an upper surface 52 of the molding compound 50. In that regard, the conductive wires 38 may be hidden within the conductive bump height. For instance in one embodiment, the conductive wires 38 extend beyond the upper surface of the redistribution layer 40 by less than 70 microns, as indicated in FIG. 1 by distance X. In that regard, the upper surface 52 of the molding compound 52 may extend less than 140 microns above the upper surface of the redistribution layer 40 as indicated in FIG. 1 by distance Y. The conductive bumps 46 may have a dimension, such as a diameter, of 250 microns.

The molding compound 50 is any material configured to protect the dice 12, 14 from the external environment and may also provide mechanical support to one or more of the dice 12, 14. For instance, the molding compound 50 may include one or more of epoxy, resins, polymers, hardeners, silicas, catalysts, pigments, and release agents.

The package 10 has two dimensions that are delimited the dimensions of the MEMS die 12 itself. In particular, a length (in the horizontal of the page) and a width (into the page) of the MEMS die 12 delimit the length and width of the package 10.

FIGS. 2A-2D illustrate a method of forming the package 10 of FIG. 1 in accordance with one embodiment. FIG. 2A shows a plurality of MEMS dice 12 formed on a wafer 60. The MEMS dice on the wafer include the MEMS die of FIG. 1 as well as mirror images of the MEMS die of FIG. 1. It is to be appreciated that only a portion of the wafer 60 is shown.

In FIG. 2B, ASIC dice 14 are secured to the MEMS dice 12 by the adhesive material 34 forming an assembly wafer 60a. The conductive bumps 46 may have been previously formed on the contact pads 44 of the redistribution layer 40 on the ASIC dice 14 while the ASIC dice 14 were in wafer form. Alternatively, the conductive bumps 46 may be formed on the contact pads 44 after the ASIC dice 14 have been secured to the MEMS dice 12.

As shown in FIG. 2C, the conductive wires 38 are coupled to the contact pads 44 of the redistribution layer 40 and to bond pads 28 of the MEMS die 12. The conductive wires 38 may be coupled to the contact pad 44 of the redistribution layer 40 in a manner that minimizes a height of the conductive wire 38. In that regard, a height (in the vertical of the package) may be minimized. In particular, in order to minimize a height of the conductive wires 38 above the redistribution layer 40, a first end 62 of the conductive wire 38 is first coupled to the contact pad 44 of the redistribution layer 40 and then a second end 64 of the conductive wire 38 is coupled to the bond pad 28 of the MEMS die 12.

As shown in FIG. 2D, the molding compound 50 is formed over the MEMS die 12 and the ASIC die 14 and surrounds the conductive wires 38. The molding compound 50 is formed in a compression molding process with release film assist. In particular, a mold includes a compressible release film on a surface thereof. The compressible film may be a 200 micron thick Ethylene tetrafluoroethylene (ETFE) film, in one embodiment. The assembly wafer 60a as shown in FIG. 2C is placed in the mold with the conductive bumps 46 facing the compressible film. Molding compound is introduced into the mold, either as dispensed granules of selected size and distribution or as injected or poured liquid a selected viscosity. Pressure is applied to the mold causing the conductive bumps 46 to embed into the compressible film, thereby pushing molding compound 50 in the mold away from the upper surface of the conductive bumps 46 such that an upper portion of the conductive bumps 46 protrude beyond an upper surface of the molding compound 50.

The molding compound 50 may harden over time and may include a heating or curing step. Once the molding compound 50 hardens, the molded wafer 60b may be removed from the mold. In one embodiment, the molding compound may be injected into the mold when the conductive bumps 46 have been embedded into the compressible film, thereby preventing the molding compound from flowing therebetween.

After removing the molded wafer 60b from the mold, the molded wafer 60b is singulated into individual packages 10 along kerf lines located between the individual packages 10 as indicated by the dashed lines in FIG. 2D. The molded wafer 60b may be singulated using any suitable method, such as by saw blade or laser.

Figure 3:
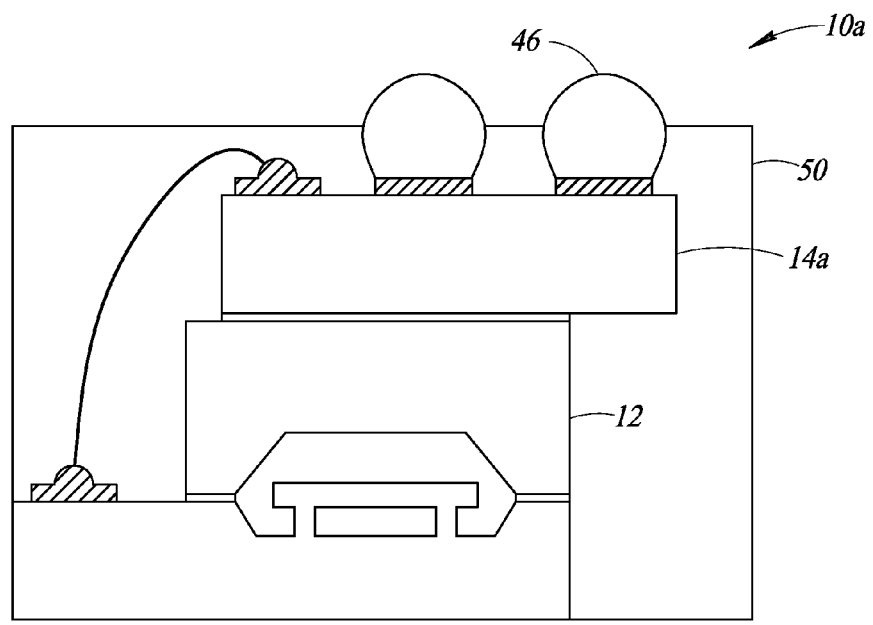
FIG. 3 shows a package according to another embodiment of the disclosure.

FIG. 3 shows a package 10a in accordance with another embodiment. The package 10a is substantially identical in the structure and function of package 10 of FIG. 1 except that the ASIC die 14a of FIG. 3 is larger than the ASIC die 14 of FIG. 1. In that regard, the ASIC die 14a may have a portion that overhangs beyond the upper surface 20 of the second portion 24 of the MEMS die 12. The molding compound 50 surrounds the ASIC die 14a and provides mechanical support for the ASIC die 14a. Although not shown, the package 10a may also include a coating on the bottom surface of the MEMS die 12. In this embodiment, the MEMS die 12 delimits one dimension of the package 10a. In the illustrated embodiment, the MEMS die 12 delimits the width of package 10a.

Figure 4:
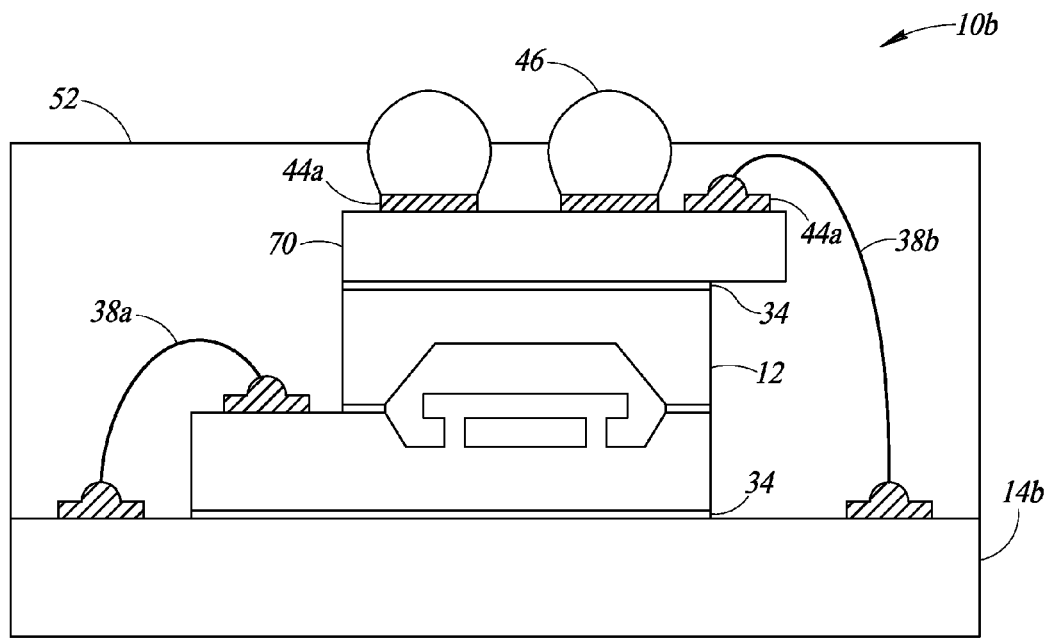
FIG. 4 shows a package according to yet another embodiment of the disclosure.

FIG. 4 shows a package 10b in accordance with another embodiment. The package 10a is substantially identical in the structure and function of package 10 of FIG. 1 except as described below. The package of 10b illustrates the embodiment in which the ASIC 14b has larger width and length dimensions than the MEMS die 12. Thus, the ASIC 14b forms the bottom surface of the package 10b and the MEMS die 12 is secured to a surface of the ASIC die 14b by adhesive material 34. The MEMS die 12 is electrically coupled to the ASIC die 14b by conductive wires 38a.

Over the MEMS die 12 there is provided a connector die 70. The connector die includes suitable conductive and insulative layers to provide electrical connection between the ASIC die 14b and components outside of the package 10b. The connector die 70 may be formed from a semiconductor material or from an insulative material, such as glass. The connector die may include contact pads 44a, traces, and through vias separated by insulative materials.

The connector die 70 is coupled to the ASIC die 14b by conductive wires 38b in a similar manner as described in reference to conductive wires 38 of package 10 of FIGS. 1 and 2A-2D. The molding compound 50 is located over the ASIC die 14b and encapsulates the conductive wires 38a, 38b, MEMS die 12, and connector die 70. Conductive bumps 46 are secured to a surface of the contact pads 44a of the connector die 70 and extend from the upper surface 52 of the molding compound 50 in the same way as described in regard to package 10. The package 10b has a length and width that is delimited by the ASIC die 14b.

In forming the package 10b, the MEMS die 12, the ASIC die 14b and the connector die 70 may be secured to each other in any order. In one embodiment, the MEMS die 12 are secured to ASIC dice 14b while the ASIC dice 14b are in wafer form. The connector dice 70 may then be secured to MEMS dice 12 or alternatively, may be secured to the MEMS dice 12 previously while the MEMS dice were still in wafer form. The remaining methods for forming the package 10b are substantially the same as methods described for forming package 10 in reference to FIGS. 2A-2D.

Figure 5:
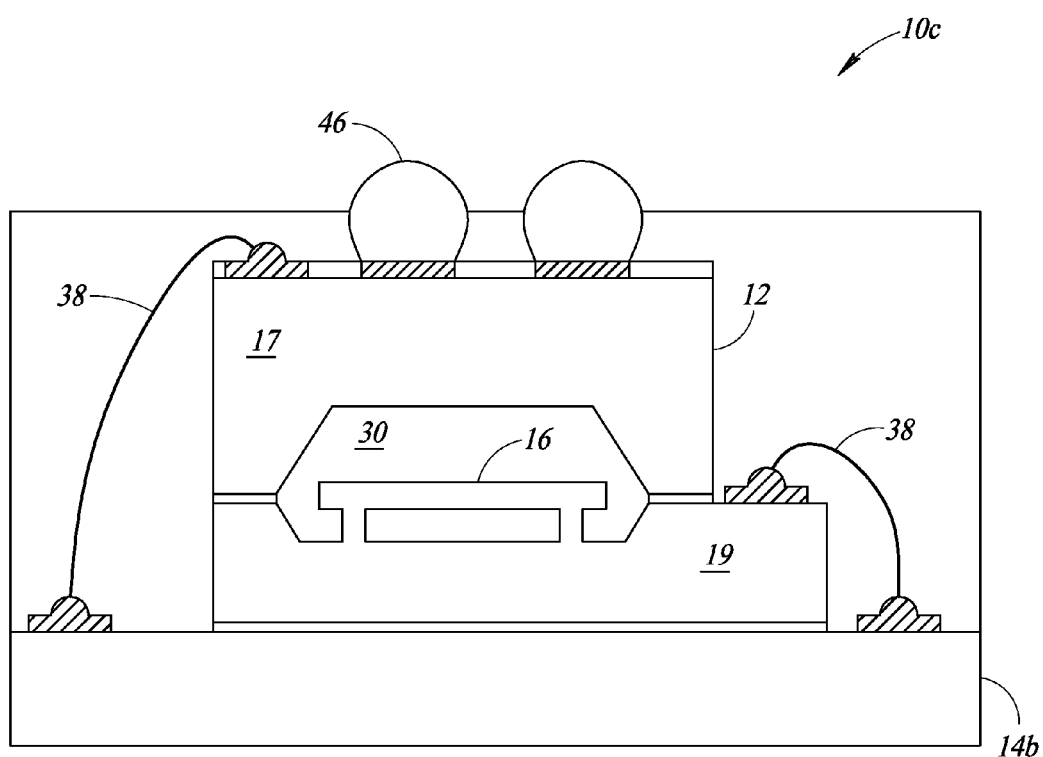
FIG. 5 shows a package according to yet another embodiment of the disclosure.

FIG. 5 shows a package 10c in accordance with another embodiment. The package 10c is substantially the same in structure and function to package 10b of FIG. 4 except that the connector die is formed in the cap 17 of the MEMS die 12, rather than in a separate die. In that regard, the conductive and insulative layers of the connector die may be formed in the cap 17 of the MEMS die 12. The connector die would be formed at wafer level either before or after the cap 17 is secured to the substrate 19 of the MEMS die.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A semiconductor package comprising:
   an ASIC die including a first surface and a first contact pad on the first surface;
   a cap including conductive and insulative layers, second and third surfaces, and second and third contact pads on the second surface;
   a MEMS die including fourth and fifth surfaces, the fourth surface of the MEMS die being coupled to the third surface of the cap, the fifth surface of the MEMS die being coupled to the first surface of the ASIC die;
   a first conductive wire having a first end coupled to the first contact pad of the ASIC die and a second end coupled to the second contact pad of the cap;
   a conductive bump coupled to the third contact pad of the cap; and
   molding compound over the first surface of the ASIC die, the first conductive wire, the cap, and the MEMS die, a portion of the conductive bump extending from a surface of the molding compound.

2. The semiconductor package of claim 1, further comprising a redistribution layer located on the second surface of the cap and including conductive traces and pads that electrically couple the conductive bump to the third contact pad of the cap.

3. The semiconductor package of claim 1, wherein one or more dimensions of the MEMS die are smaller than one or more dimensions of the ASIC die.

4. The semiconductor package of claim 1, wherein the MEMS die is embedded in the molding compound.

5. The semiconductor package of claim 1, wherein the conductive bump is coupled to a circuit board.

6. The semiconductor package of claim 1, wherein the ASIC die includes second surface that forms an outer surface of the semiconductor package.

7. The semiconductor package of claim 1, wherein the ASIC die further includes a fourth contact pad on the first surface, and the MEMS die further includes a fifth contact pad on the fourth surface, the semiconductor package further including a second conductive wire having a third end coupled to the fourth contact pad and a fourth end coupled to the fifth contact pad.

8. A semiconductor package comprising:
   an ASIC die having a first surface and first and second sets of contact pads on the first surface;
   a connector die including conductive and insulative layers and having first and second sets of contact pads;
   a MEMS die located between the connector die and the ASIC die, the MEMS die having a plurality of bond pads;
   conductive bumps coupled to the first set of contact pads of the connector die;

a first set of conductive wires having first ends coupled to the second set of contact pads of the connector die and second ends coupled to the first set of contact pads of the ASIC die;

a second set of conductive wires having first ends coupled to the plurality of bond pads of the MEMS die and second ends coupled to the second set of contact pads of the ASIC die;

molding compound over the first surface of the ASIC die, the connector die, the MEMS die, and the first and second sets of conductive wires, a portion of the conductive bumps extending from a surface of the molding compound.

9. The semiconductor package of claim 8, wherein the first set of contact pads are adjacent a first side of the ASIC die and the second set of contact pads are adjacent a second side of the ASIC die.

10. The semiconductor package of claim 9, wherein the MEMS die is coupled to the first surface of the ASIC die between the first and second sets of contact pads of the ASIC die.

11. The semiconductor package of claim 8, wherein the connector die forms a cap to cover a sensor of the MEMS die.

12. The semiconductor package of claim 8, wherein the ASIC die has a second surface opposite the first surface, the second surface forming an outer surface of the semiconductor package.

13. The semiconductor package of claim 8, wherein the connector die has a portion that extends beyond the MEMS die.

14. The semiconductor package of claim 8, wherein the connector die and the conductive bumps are configured to electrically couple the ASIC die to another component outside of the semiconductor package.

15. The semiconductor package of claim 8, further comprising a cap is positioned between the connector die and the MEMS die.

16. A semiconductor package, comprising:
a first die having a first surface with a first surface area;
a first contact pad on the first surface of the first die;
a cap on the first surface of the first die, the cap having a second surface;
a second die on the second surface of the cap, the second die having a third surface with a second surface area that is smaller than the first surface area, a portion of the second die overhanging beyond the second surface of the cap;
a second contact pad on the third surface of the second die; and
a conductive bump on the second contact pad.

17. The semiconductor package of claim 16, further comprising:
a third contact pad on the third surface of the second die; and
a first conductive wire coupled to the first and third contact pads.

18. The semiconductor package of claim 16, wherein the second die is a connector die having conductive and insulative layers.

19. The semiconductor package of claim 18, further comprising:
a third die having a fourth surface having a third surface area that is larger than the first surface area, the first die being on the fourth surface of the third die.

20. The semiconductor package of claim 19, further comprising:
a third contact pad on the third surface of the second die;
a fourth and fifth contact pad on the fourth surface of the third die;
a first conductive wire coupled to the third and fourth contact pads; and
a second conductive wire coupled to the first and fifth contact pads.

21. The semiconductor package of claim 19, wherein a portion of the second die overhangs third die.

* * * * *